United States Patent [19]

Hack et al.

[11] Patent Number: 4,990,977
[45] Date of Patent: Feb. 5, 1991

[54] HIGH CURRENT THIN FILM TRANSISTOR

[75] Inventors: Michael Hack, Mountain View; John G. Shaw, Portola Valley, both of Calif.; Michael Shur, Golden Valley, Minn.

[73] Assignee: Xerox Corporation, Stamford, Conn.

[21] Appl. No.: 174,652

[22] Filed: Mar. 29, 1988

[51] Int. Cl.$^5$ ............................................. H01L 29/78
[52] U.S. Cl. ..................... 357/23.4; 357/4; 357/23.7; 357/23.11; 357/52; 357/53; 357/55
[58] Field of Search ................ 357/23.4, 23.7, 23.14, 357/52, 53, 55

[56] References Cited

U.S. PATENT DOCUMENTS

| | | | |
|---|---|---|---|
| 4,746,960 | 5/1988 | Valeri et al. | 357/23.7 |
| 4,803,533 | 2/1989 | Chang et al. | 357/23.4 |
| 4,866,495 | 9/1989 | Kinzer | 357/52 |

Primary Examiner—Edward J. Wojciechowicz
Attorney, Agent, or Firm—Serge Abend

[57] ABSTRACT

A thin film transistor including a substrate upon which are supported a gate electrode layer, a gate dielectric layer, at least one finger-like source electrode, a semiconductor layer overlying the gate dielectric layer and at least partially surrounding the source electrode, and a drain electrode layer contiguous with the semiconductor layer. The length of the current path between the source electrode and the drain electrode layer is defined by a first path portion located at the semiconductor/gate dielectric interface and extending, between adjacent source elements, substantially parallel to the interface, and a second path portion whose length is substantially coextensive with the thickness of the semiconductor layer.

17 Claims, 4 Drawing Sheets

HIGH CURRENT THIN FILM TRANSISTOR

FIELD OF THE INVENTION

This invention relates to a high current, moderate voltage, thin film transistor having an extremely short current flow path formed without use of critical lithography. More particularly, the transistor device of this invention has a gate electrode which controls the conductivity of the gate dielectric/semiconductor interface for allowing lateral current flow paths to be established from the source electrode into the semiconductor bulk where the current flow path is normally redirected to the drain electrode and is space charge limited.

BACKGROUND OF THE INVENTION

Because of their relative ease of fabrication on large area substrates thin film transistors (TFTs) have been actively studied for use in driving individual pixels in large area displays, such as liquid crystal displays. The TFTs generally comprise spaced apart source and drain electrodes, held at different potentials, and electrically interconnected by a semiconductor material which forms a channel therebetween. Current flow between these electrodes, is controlled by the application of a voltage to a gate electrode, which is adjacent a portion of the semiconductor material and is insulated therefrom. The gate field acts to invert or accumulate a portion of the semiconductor material, allowing current to flow therethrough from the source to the drain.

Amorphous silicon technology was initially developed primarily for photovoltaics but recently the microelectronic applications therefor have become more and more important. They are ideally suited for use in large area arrays because of the low deposition temperatures involved in their fabrication and the availability of large area deposition and lithographic equipment. Although amorphous silicon has been the most promising semiconductor material for TFTs, other materials such as Ge, GaAs, CdS, polycrystalline silicon and microcrystalline silicon have been found to be satisfactory. A shortcoming of amorphous silicon is its relatively low electron mobility which limits the operating speed of these transistors. In order to improve the operating speed and to increase the output current, reduction of the channel length L is very important because the transit time of electrons across a channel is proportional to $L^2$ and the output current is inversely proportional to the channel length (1/L). Typically, lithographically produced TFTs have channel lengths of about 10 $\mu$m. Of course, the channel length could possibly be decreased substantially by using critical lithographic techniques developed for VLSI fabrication, but this solution is very costly and is impractical over the large areas contemplated. In fact, it is likely that a one micron feature size cannot be accurately maintained over very large areas.

In spite of the fact that the amorphous silicon electron band mobility is 10 to 20 cm$^2$/volt-sec, these TFTs operate with a field effect mobility of around 1 cm$^2$/volt-sec. This is due to the fact that traps in the form of localized tail states allow only a small fraction (about 10 to 20%) of the charge induced into the channel of these TFTs to become mobile carriers. For a 10 $\mu$m feature size and gate width-to-length ratio of 10, one may expect output currents on the order of 10 to 50 $\mu$amp and a transit time of approximately 100 nsec for drive voltages in the range of 10 to 20 volts. In practice switching speeds also will be reduced by circuit capacitances. Improved current drive capabilities necessitate shorter channel lengths.

One form of short channel thin film transistor is to be found in U.S. Pat. No. 4,547,789 comprising a mesa-like formation including vertically stacked source and drain regions separated by an insulating layer. A plurality of thin layers including a semiconductor layer, a gate dielectric layer and a gate electrode layer overlie the mesa and extend between the source and drain regions along its side walls. Two short current conduction channels (one on either side of the mesa) are thus formed. The thickness of the insulating layer between the source and drain regions determines the current conduction channel length through the side wall semiconductor layer. In this matter, the channel length can be very accurately controlled without critical lithography.

Several other short channel TFT structures are disclosed in an article entitled "Vertical-Type a-Si:H Field-Effect Transistors" by Uchida et al. of Tokyo Institute of Technology, published in Materials Research Society Symposium Proceedings, Vol. 33 (1984), at pages 287-292. In each described structure current flow is controlled from source to drain electrode layers disposed in a stack, by means of thin sidewall gate electrode layers controlling a sidewall semiconductor layer.

In the devices of both the '789 patent and the Uchida et al article, very narrow channels are formed in the sidewall regions between the source and drain electrode, at the semiconductor/gate dielectric interface. The current flow is perpendicular to the direction of the gate field, as in conventional TFTs. These short channel devices have low ON/OFF ratios at moderate source to drain voltage and therefore have limited voltage handling capabilities.

It is the object of the present invention to provide a unique short channel thin film transistor having a unique structure wherein the gate electrode is located, relative to the source electrode, on the side remote from the drain electrode and wherein current flow is parallel to the gate field over the majority of the device.

It is another object of the present invention to provide a vertical thin film transistor whose effective channel length is much less than any minimum lithographic feature size used in its fabrication.

It is a further object of this invention to provide a vertical thin film transistor having barrier means between the source electrode and the semiconductor channel layer which barrier means is controlled by the gate electrode, so as to improve the ON/OFF current ratio of the device and to improve output saturation characteristics.

A still further object of this invention is to form the source electrode as a series of stripes or fingers electrically connected in parallel so as to increase the effective channel area.

SUMMARY OF THE INVENTION

The present invention may be carried out, in one form, by providing a thin film transistor comprising a substrate upon which are supported a gate electrode layer, a gate dielectric layer, at least one finger-like source electrode, a semiconductor layer overlying the gate dielectric layer and at least partially surrounding the source electrode, and a drain electrode layer contiguous with the semiconductor layer. The length of the current path between the source electrode and the drain electrode layer is defined by a first path portion located at the semiconductor/gate dielectric interface and extending, between adjacent source elements, substantially parallel to the interface, and a second path portion whose length is substantially coextensive with the thickness of the semiconductor layer.

BRIEF DESCRIPTION OF THE DRAWINGS

Other objects and further features and advantages of this invention will be apparent from the following, more particular, description considered together with the accompanying drawings, wherein.

DESCRIPTION OF THE ILLUSTRATED EMBODIMENTS

Figure 1:
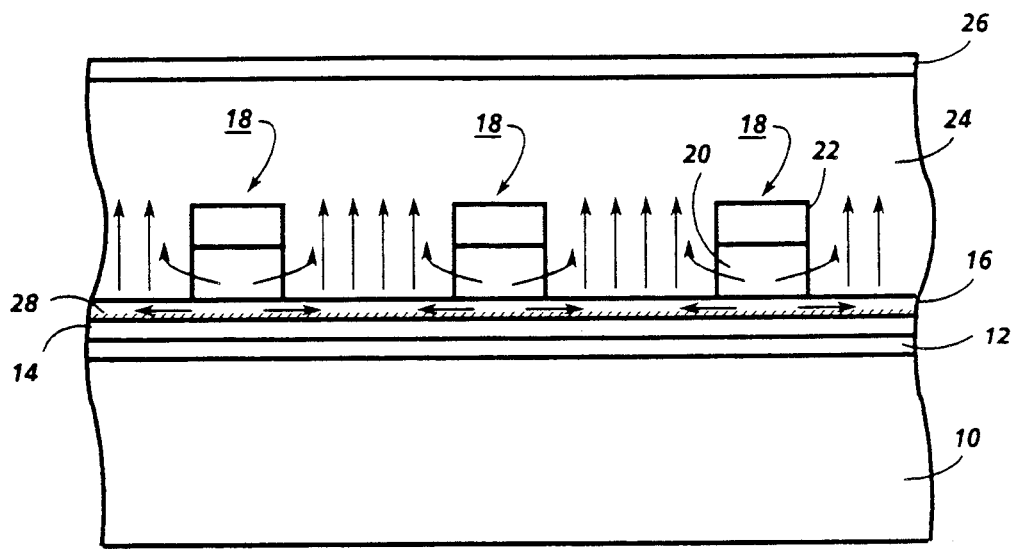
FIG. 1 is a side sectional view of a thin film transistor according to the present invention.

Turning now to FIG. 1 there is illustrated a novel device we refer to as a vertical, bottom gate, short channel, thin film transistor. By vertical we means that the charge carriers travel through the thickness of the semiconductor layer in the direction parallel to the direction of the gate field, as opposed to travelling within a narrow channel extending in the direction perpendicular to the gate field. We have found this vertical orientation to be desirable because it enables the current path between source and drain electrodes to be established virtually by the thickness of an intermediate charge conducting layer and not by lithography. Furthermore, it separates the gate and drain electrodes such that not all of the gate to drain potential is dropped across the thin gate dielectric. It is well known that the art of layer deposition allows accurate formation of layers on the order of tens of Angstroms. This transistor configuration allows one to obtain the performance of 1 micron channel lengths while using 5 to 10 μm lithography or larger.

Upon a suitable substrate 10, such as glass, there is deposited a conducting gate electrode layer 12 (about 500 to 1000 Å), preferably metallic, such as chromium, over which lies a gate dielectric layer 14 (about 100 to 5000 Å), such as silicon nitride, silicon oxide or other thin film insulating material. A thin semiconductor layer 16 (about 100 to 2000 Å), such as intrinsic or lightly doped amorphous silicon, overlies the gate dielectric. A source electrode 18, comprising one or more generally parallel stripes or fingers, overlies the semiconductor layer 16. Each finger includes a stack having an n+ doped semiconductor stripe 20 (about 100 to 500Å) adjacent layer 16, over which there is placed a metal stripe 22 (about 1000 to 10,000Å), such as a titanium/tungsten alloy. A semiconductor charge transport layer 24 (about 2000 to 40,000Å), such as intrinsic or lightly doped amorphous silicon, overlies the semiconductive layer 16 and surrounds the source electrode fingers 18 on three sides. A drain electrode layer 26, made of an n+ doped semiconductor (about 1000 to 20,000Å), in turn overlies the charge transport layer 24. The dimensions given are representative of typical ranges which we have used in our experimentation and/or modelling, but are not intended to limit the size of these elements in future devices.

When forming the fingers, planar layers of the n+ doped semiconductor and suitable metal are deposited and are then etched to result in the desired configuration. The thin semiconductor layer 16 is provided so that the critical interface between the gate dielectric 14 and the semiconductor material is not damaged during etching of the source fingers. Each TFT may include one or more source electrode fingers. If a device includes several fingers, they may be electrically connected in parallel.

As will become apparent, the cumulative thickness of semiconductor layers 16 and 24 substantially determines the source to drain distance. The bulk semiconductor layer 24 and the thin semiconductor layer 16 preferably comprise undoped or lightly doped silicon in its amorphous, microcrystalline or polycrystalline form. One or both of these layers may be germanium or other suitable material. Similarly, the n-doped source and drain elements may be any suitable semiconductor in its amorphous, microcrystalline or polycrystalline forms. Although n-type doping is preferred, p-type doping may be used.

In operation of the FIG. 1 TFT device, the source and drain electrodes have a drive potential maintained therebetween. The Schottky barrier provided by the metal layer 22 will prevent current flow in the direct vertical path between source and drain. Therefore, the source/drain fields extend vertically through the bulk semiconductor layer 24 and bend laterally to the side walls of the n+ source fingers. Current can only flow laterally out of the side walls of the fingers 18. When the device is turned ON, as by applying a control bias to the gate electrode, an accumulation channel 28 is formed at the interface between the semiconductor layer (16) and the gate dielectric in the region between source electrode fingers. Current flow follows the paths indicated by the arrows, namely, initially laterally into the accumulation region and then vertically through the semiconductor layers to the drain electrode. It should be noted that when the semiconductor charge transport layer is intrinsic, or lightly doped, amorphous silicon, vertical current flow is space charge limited.

Although there is a slight barrier to the passage of charge carriers out of the n+ fingers 20 at the n+/bulk semiconductor interface, it has been observed that charge carriers can spill out the sides of the n+ source fingers under the influence of $V_{DS}$ and the output current always increases with increasing drain voltage, even at zero gate voltage. Therefore, the device cannot be shut off very effectively. ON/OFF ratios of several hundred-fold to about a thousand fold, at useful source to drain voltages, are possible, and although these values are comparable to many known TFTs they are not entirely practical. In any truly commercially acceptable vertical TFT, the current flow from source to drain must be modulated by the gate field and the leakage current (current flow with the drain ON but the gate OFF) must be low. The challenge in designing such devices is to devise practical means for suppressing leakage while also improving the saturation of the output characteristics. Both of these goals can be accomplished by preventing the drain potential from directly reaching the source and drawing out charge carriers.

However, by applying a negative gate bias, it is also possible to improve the ON/OFF ratio of the FIG. 1 device independently of any change in saturation.

Figure 2:
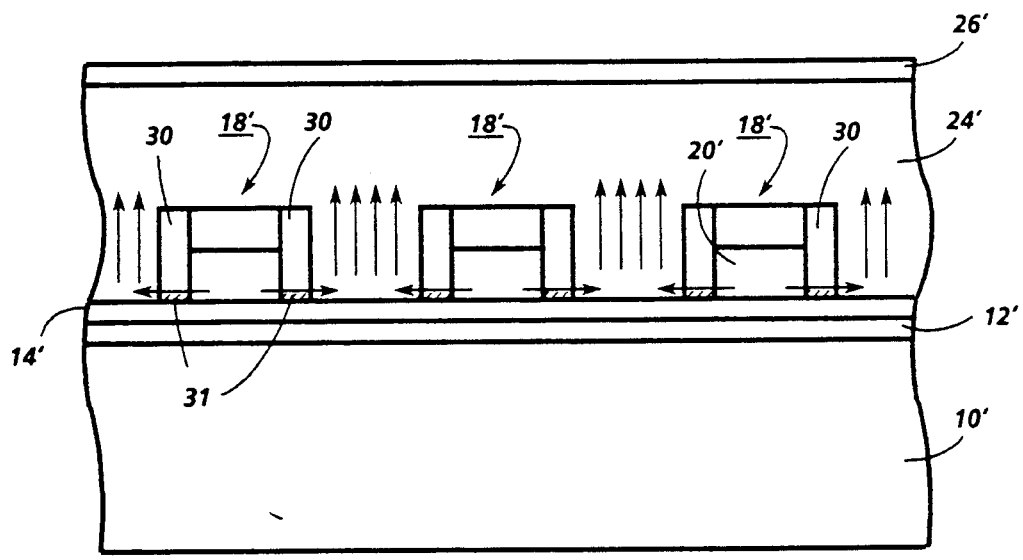
FIG. 2 is a side sectional view of a thin film transistor similar to that of FIG. 1 including direct current barrier means.
Figure 5:
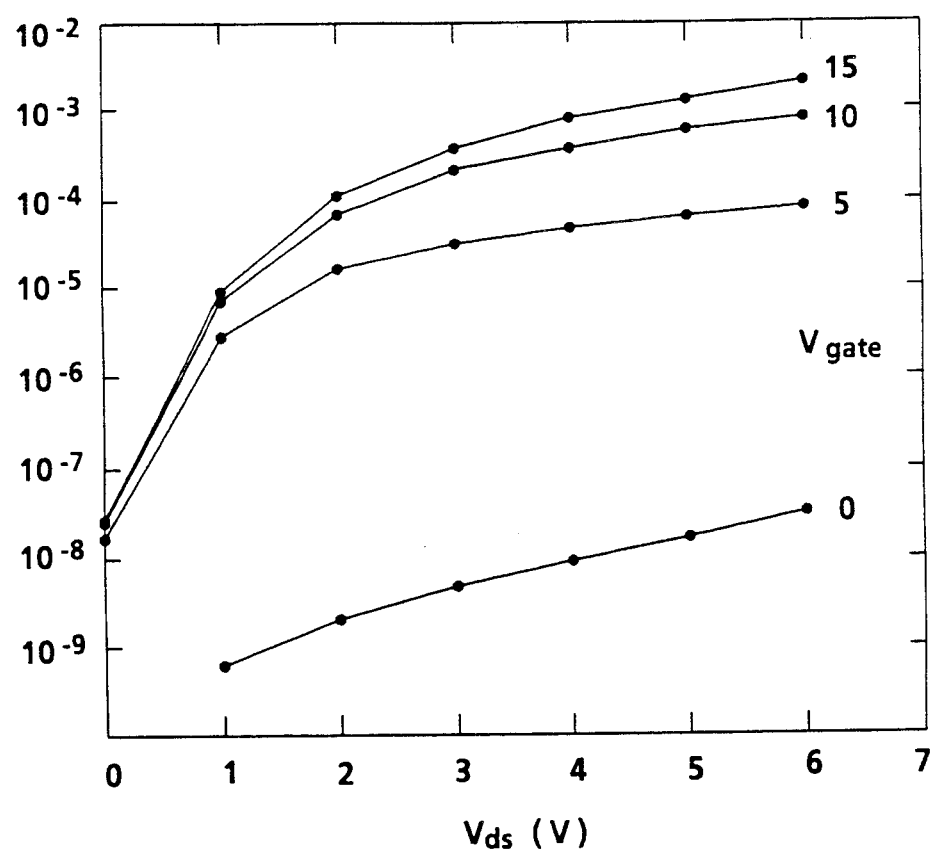
FIGS. 5 and 6 illustrate output characteristics for the devices of FIGS. 2 and 3, respectively.

Several modified forms of our bottom gate vertical short channel TFT have been devised to increase the low ON/OFF ratio and to improve saturation of the basic device. In FIG. 2 there is illustrated virtually the same basic device as in FIG. 1, with barrier elements introduced to prevent OFF state leakage. SImilar elements have been identified by similar numerals with a prime (') added. Lightly p-doped (p−) semiconductor sidewall members 30 (about 1000 to 5000Å wise) have been deposited adjacent the source electrode fingers 18', and have been found to improve the dynamic range of the device. In the OFF state, the p− sidewalls provide effective barriers to the flow of charge carriers from the source electrode fingers 20' into the bulk semiconductor layer 24'. When the gate field is applied, so that the device is in its ON state, the portions of the sidewall barrier elements 30 adjacent the gate dielectric 14', on both sides of the source electrode fingers, are inverted to form channels 31 through which current flows (as indicated by the arrows). It can be seen in FIG. 5 that the leakage current of this device is quite low ($V_G=0$) and the current output has good saturation characteristics.

Notwithstanding improvements in the ON/OFF ratio, the ON state current flow is somewhat decreased because the dopant in the p− barrier members introduce defects which reduce its conductivity. This shortcoming is material dependent, being true of amorphous silicon but not true of crystalline silicon. While this form of our device has an ON/OFF ratio of approximately five orders of magnitude it would be desirable to use a blocking scheme that does not significantly reduce the ON current.

Figure 3:
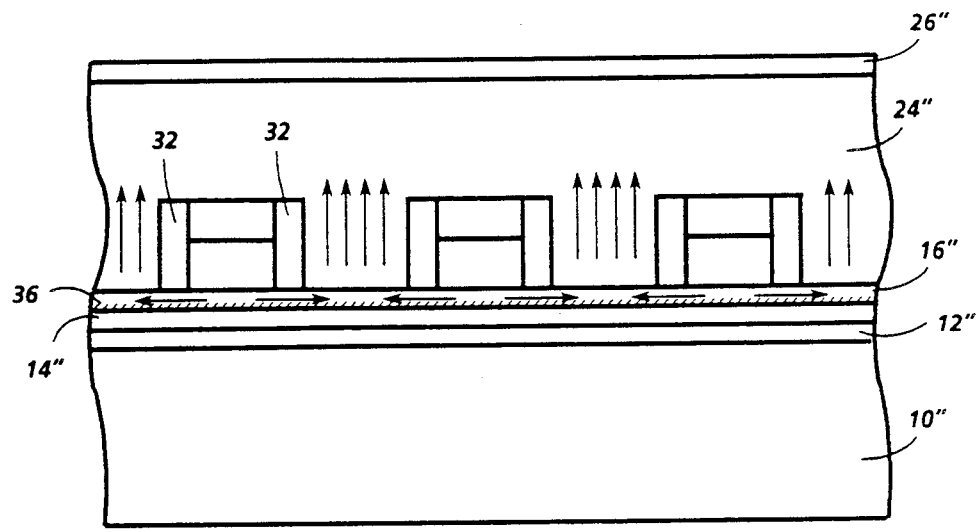
FIG. 3 is a side sectional view of a thin film transistor similar to that of FIG. 1 including proximity current barrier means.

In FIG. 3 there is shown another embodiment of the bottom gate vertical short channel TFT in which there is a layer which can pinch off the leakage channel but through which no current flows. We refer to this as a proximity blocking layer. Similar element have been identified by similar numerals with a double prime (") added. The thin semiconductor layer 16" is again disposed between each source electrode finger 18" and the gate dielectric layer 14". Heavily p-doped (p+) sidewalls 32 (about 1000 to 5000Å wide) lie adjacent each side of the source electrode fingers. The bottom ends 34 of the p+ sidewalls are spaced from the gate dielectric by the thickness of the semiconductor layer (about 500 Å) so as to allow a path for charge carriers to flow from the source electrode through that semiconductor layer into the bulk semiconductor layer 24". A proximity barrier is provided by the heavily p-doped sidewalls, due to the spillover of its carriers (holes) into, or depletion of electrons from, the semiconductor layer 16" which induce a p-type region therein. As electrons try to pass through this proximity barrier under the influence of $V_{DS}$, their lifetimes will be reduced, thereby suppressing current leakage in the OFF condition of the device. When the device is turned ON, by applying a gate field, an accumulation region will be formed as the holes are repelled back into the ends 34 of the heavily p+ sidewalls 32, thus creating a channel region 36 at the semiconductor/gate dielectric interface and allowing the free flow of electrons through substantially undoped semiconductor material (layer 16"). Anther factor in suppressing the OFF state leakage current is the field plate effect of the p+ layer, held at the source potential (the same as the gate potential), which reduces the drain field entering the channel region of the semiconductor layer 16" and prevents the drain field from reaching the source electrode. This effect also helps saturation.

Figure 6:
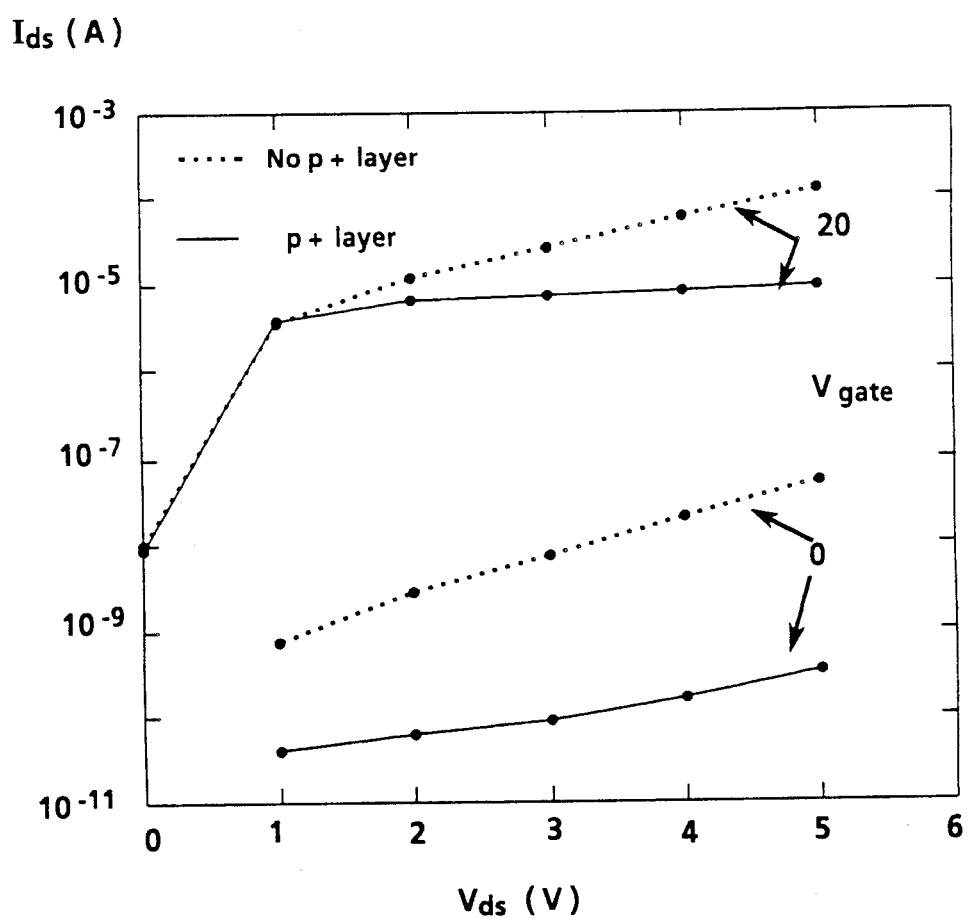

FIG. 6 shows the comparative characteristics of the action of a p+ proximity blocking layer on a device fabricated such that one half contained a blocking means (illustrated by solid lines), of the type described in FIG. 3, and the other half contained no blocking means (illustrated by dotted lines), of the type described in FIG. 1. The leakage current at $V_{DS}=5$ volts is suppressed by over two orders of magnitude by the proximity p+ layer. Also, it can be seen that this layer is effective in improving output current saturation when the device is turned ON. This is because the current flow is through an accumulation channel in the semiconductor layer 16" under the p+ blocking layer. The highly conducting channel tends to prevent the source from being directly coupled to the drain potential.

In the device of the present invention we are able to improve the ON/OFF current ratio substantially by inducing a pseudo player into the channels between the ends 34 of the p+ sidewalls 32 and the protective semiconductor layer 16". A pseudo player has the advantage that it provides the desired barrier effect in the OFF mode of the device, but does not introduce defects into the semiconductor channel in the ON mode, which would occur if the barrier region were actually doped as in the FIG. 2 embodiment.

Figure 4:
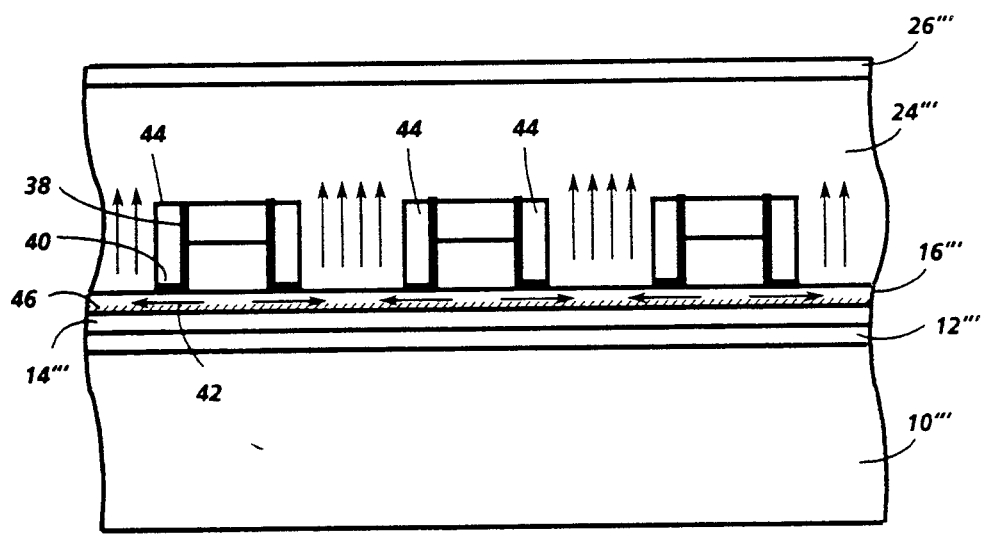
FIG. 4 is a side sectional view of a thin film transistor similar to that of FIG. 1 showing another form of proximity current barrier means.

In FIG. 4 there is shown a shield plate or field plate embodiment, in which the ON/OFF ratio of a short channel thin film TFT is improved by means of the introduction of a barrier to the passage of charge carriers, in the form of a metal cladding layer (such as chromium) having sidewalls 38 and outboard flanges 40. The sidewalls block charge carrier movement through the sides of the source electrode fingers 18'" and the flanges define blocking tunnels 42 in the semiconductor layer 16'". Masking members 44, lying on either side of the metal cladding layer serve only to aid in fabrication by defining the length of the flanges and, thereby, the tunnel. These masking members may be made of silicon nitride or p-type semiconductor. The blocking mechanism of the tunnel is somewhat different from the proximity blocking of the FIG. 3 embodiment. The desired blocking effect is provided, in the OFF state, by the tunnel, or gauntlet region, lying between the gate electrode layer 12'" and the metal flanges 40, held at the same potential (usually ground). Since the source electrode fingers are grounded, the adjacent metal capping layer will also be grounded. By forming the tunnel a few thousand Angstroms in length, the field emanating from the higher potential drain electrode layer 26'" will not be able to penetrate the ground potential tunnel 42 and extend to the source electrode. Thus, this metal layer acts as a field plate in shielding the source from the drain potential. When a switching potential is applied to the gate electrode, the interface region between the semiconductor layer 16'" and the gate dielectric layer 14'" is accumulated and a channel 46 is formed, through which charge carriers may flow laterally outwardly. As the charge carriers reach the region of the bulk semiconductor 24'" they change direction and flow to the drain electrode under space charge limited conditions. Thus, the source to drain current path may be viewed as an accumulation channel in series with a space charge limited conduction zone. Increasing the drain voltage above that required to support the space charge limited current flow will result in the potential at the edge of this accumulation region also increasing and this will limit current flow into the space charge limited current region, leading to saturating output characteristics.

It should be understood that the present disclosure has been made only by way of example and that numerous other changes in details of construction and the combination and arrangement of elements may be resorted to without departing from the true spirit and scope of the invention as hereinafter claimed.

What is claimed:

1. A thin film transistor comprising a substrate, gate electrode means overlying said substrate, gate dielectric means overlying said gate electrode means, source electrode means overlying said gate dielectric means, substantially undoped non-single crystal semiconductor means overlying said gate dielectric means and surrounding said source means, drain electrode mean contiguous with said semiconductor means and spaced from said gate dielectric means, the thickness of said semiconductor means substantially defining the source to drain separation distance and electrically conducting blocking means located adjacent to said source electrode means, said blocking means being separated from said gate dielectric means by a portion of said semiconductor means, and said blocking means cooperating with said gate electrode means for providing an electrostatic shield so as to prevent a drain field from reaching said source electrode means through said portion of said semiconductor means in the OFF sate of said transistor, and wherein source to drain current flow through said semiconductor means, in the ON state of said transistor, is controlled by said gate electrode means inducing a conducting channel through said portion of said semiconductor means for overcoming the blocking effect of said electrostatic shield.

2. A thin film transistor comprising a substrate supporting gate electrode means, a gate dielectric overlying said gate electrode means source electrode means overlying said gate dielectric means, non-single crystal semiconductor charge transport means overlying said gate dielectric means and surrounding said source electrode means, drain electrode means overlying said semiconductor charge transport means, wherein the source to drain current path includes a portion of said semiconductor means located adjacent the interface between said semiconductor means and said gate dielectric, and another portion of said semiconductor means, in series with said portion, through which space charge controlled current flows through the thickness of said semiconductor means to said drain electrode means, and electrically conductive blocking means located adjacent said source electrode means and said portion of said current path and cooperating with said gate electrode means for preventing a drain field from reaching said source electrode means through said portion of said current path in the OFF state of said transistor.

3. The thin film transistor as defined in claim 1 or 2 wherein said semiconductor means comprises intrinsic amorphous silicon and said blocking means comprises p-doped amorphous silicon.

4. The thin film transistor as defined in claim 1 or 2 wherein said blocking means is located adjacent the side walls of said source electrode means.

5. The thin film transistor as defined in claim 4 wherein said blocking means establishes a proximity barrier to current flow through said portion of said semiconductor means in the absence of a gate field, and wherein said proximity barrier is abated in the presence of a gate field.

6. The thin film transistor as defined in claim 5 wherein said blocking means depletes majority carriers from said channel region.

7. The thin film transistor as defined in claim 5 wherein said blocking means comprises a semiconductor material heavily doped so as to spill over, into said channel region, charge carriers of a sign opposite to the sign of the current carrying charge carriers of the transistor.

8. The thin film transistor as defined in claim 7 wherein said semiconductor means comprises intrinsic amorphous silicon and said blocking means comprises heavily p-doped amorphous silicon.

9. The thin film transistor as defined in claim 4 wherein said blocking means comprises a control electrode maintained at substantially the same potential as said source electrode means.

10. The thin film transistor as defined in claim 1 or 2 further including means for applying potentials to said blocking means so that in the OFF state of said transistor the differential in potentials between said gate electrode means and said blocking means prevents a drain field from reaching said source electrode means, and in the ON sate of said transistor, the differential in potentials enhances said semiconductor means with excess charge carriers of a sign which would carry source to drain current.

11. The thin film transistor as defined in claim 4 wherein said blocking means comprises a conductive layer having wall portions adjacent the side walls of said source electrode means for blocking charge carrier movement through said side walls of said source electrode means and outboard flange portions lying parallel to said gate dielectric means, and said flange portions comprise a control electrode maintained at substantially the same potential as said source electrode means.

12. The thin film transistor as defined in claim 1 or 2 further comprising means for applying a potential to said gate electrode means of a sign opposite to the sign of the current carrying charge carriers of the transistor.

13. A thin film transistor comprising a substrate upon which are supported,
   gate electrode means,
   a gate dielectric layer adjacent to said gate electrode means,
   source electrode means overlying said gate dielectric layer,
   a substantially intrinsic non-single crystal semiconductor charge transport layer located adjacent to said gate dielectric layer and surrounding said source electrode means,
   a drain electrode layer located adjacent to said semiconductor layer and separated from said gate dielectric layer by the thickness of said semiconductor layer,
   a channel region located in said semiconductor layer between said source electrode means and said gate dielectric layer, the conductivity of said channel region being controlled by a gate field, and
   electrically conductive means for blocking a drain field from reaching said source electrode means, said electrically conductive means being located adjacent to said source electrode means and to said channel region.

14. The thin film transistor as defined in claim 13 wherein said electrically conductive means comprises proximity barrier means which depletes majority carriers from said channel region.

15. The thin film transistor as defined in claim 13 wherein said electrically conductive means comprises proximity barrier means including semiconductor means heavily doped so as to spill over, into said channel region, charge carriers of a sign opposite to the sign of the current carrying charge carriers of the transistor.

16. The thin film transistor as defined in claim 13 wherein said electrically conductive means is maintained at substantially the same potential as said gate electrode means, when said transistor is in its OFF state so as to provide an equipotential tunnel surrounding said channel region.

17. The thin film transistor as defined in claim 13 further including means for applying potentials to said electrically conductive means and said gate electrode means so that in the OFF state of said transistor, the differential in potentials depletes said channel region of charge carriers of a sign which would carry source to drain current, and in the ON state of said transistor, the differential in potentials enhances said channel region with excess charge carriers of a sign which would carry source to drain current.

* * * * *